(12) United States Patent
Hecht et al.

(10) Patent No.: US 12,503,791 B2
(45) Date of Patent: Dec. 23, 2025

(54) METHOD OF PRODUCING EPITAXIAL LAYER WAFERS IN A CHAMBER OF A DEPOSITION REACTOR

(71) Applicant: SILTRONIC AG, Munich (DE)

(72) Inventors: Hannes Hecht, Burghausen (DE); Michael Lauer, Burghausen (DE); Korbinian Lichtenegger, Munich (DE); Walter Edmaier, Wittibreut (DE)

(73) Assignee: SILTRONIC AG, Munich (DE)

( * ) Notice: Subject to any disclaimer, the term of this patent is extended or adjusted under 35 U.S.C. 154(b) by 302 days.

(21) Appl. No.: 18/548,938

(22) PCT Filed: Feb. 25, 2022

(86) PCT No.: PCT/EP2022/054746
§ 371 (c)(1),
(2) Date: Sep. 5, 2023

(87) PCT Pub. No.: WO2022/189166
PCT Pub. Date: Sep. 15, 2022

(65) Prior Publication Data
US 2024/0150932 A1    May 9, 2024

(30) Foreign Application Priority Data
Mar. 10, 2021    (EP) ..................... 21161684

(51) Int. Cl.
*C30B 25/08*    (2006.01)
*C23C 16/44*    (2006.01)
(Continued)

(52) U.S. Cl.
CPC .......... *C30B 25/08* (2013.01); *C23C 16/4408* (2013.01); *C30B 25/165* (2013.01);
(Continued)

(58) Field of Classification Search
CPC ..... C23C 16/24; C23C 16/4408; C30B 25/08; C30B 25/165; C30B 25/20; C30B 29/06
See application file for complete search history.

(56) References Cited

U.S. PATENT DOCUMENTS

| | | |
|---|---|---|
| 2002/0061605 A1 | 5/2002 | Hasegawa et al. |
| 2008/0219824 A1 | 9/2008 | Newman et al. |
| | (Continued) | |

FOREIGN PATENT DOCUMENTS

| | | | | |
|---|---|---|---|---|
| CN | 100492599 C | * | 5/2009 | ....... H01L 21/67748 |
| CN | 111542911 A | | 8/2020 | |
| | (Continued) | | | |

OTHER PUBLICATIONS

English computer translation of CN-100492599 (Year: 2025).*
English computer translation of JP-2006070299 (Year: 2025).*

*Primary Examiner* — Matthew J Song
(74) *Attorney, Agent, or Firm* — LEYDIG, VOIT & MAYER, LTD.

(57) ABSTRACT

A method produces semiconductor wafers in a chamber of a deposition reactor of a plant. The method includes: repeatedly depositing an epitaxial layer on a substrate wafer in the chamber, producing semiconductor wafers, and at the same time: conditioning a replacement chamber outside the plant by purging the replacement chamber with a purge gas; interrupting the deposition of the epitaxial layer; replacing the chamber with the replacement chamber, after the conditioning, the replacement chamber being sealed and transported in a closed state to the plant or after the conditioning, the replacement chamber is transported to the plant and in this process purge gas is passed through the replacement chamber; and continuing the deposition of the epitaxial layer in the replacement chamber, producing a second number of semiconductor wafers.

6 Claims, 2 Drawing Sheets

(51) Int. Cl.
*C30B 25/16* (2006.01)
*H01L 21/02* (2006.01)
*C23C 16/24* (2006.01)
*C30B 25/20* (2006.01)
*C30B 29/06* (2006.01)

(52) U.S. Cl.
CPC .......... *H01L 21/0262* (2013.01); *C23C 16/24* (2013.01); *C30B 25/20* (2013.01); *C30B 29/06* (2013.01); *H01L 21/02381* (2013.01); *H01L 21/02532* (2013.01); *H01L 21/0254* (2013.01)

(56) References Cited

U.S. PATENT DOCUMENTS

| | | | |
|---|---|---|---|
| 2009/0143890 A1* | 6/2009 | Morisawa | C23C 16/52 700/108 |
| 2019/0093215 A1* | 3/2019 | Kang | C30B 25/10 |
| 2019/0338443 A1 | 11/2019 | Tsuji et al. | |
| 2019/0362989 A1* | 11/2019 | Reuter | H01L 21/67109 |
| 2020/0006050 A1 | 1/2020 | Houng | |
| 2020/0385861 A1 | 12/2020 | Deye et al. | |
| 2020/0392618 A1 | 12/2020 | Kinose | |

FOREIGN PATENT DOCUMENTS

| | | | | |
|---|---|---|---|---|
| DE | 10042881 A1 | 5/2001 | | |
| DE | 112016003399 T5 | 4/2018 | | |
| EP | 0601461 A1 | 6/1994 | | |
| JP | 2000021784 A | 1/2000 | | |
| JP | 2003306771 A | 10/2003 | | |
| JP | 2006070299 A | * 3/2006 | ............ | C23C 16/44 |
| JP | 2020025038 A | 2/2020 | | |

\* cited by examiner

METHOD OF PRODUCING EPITAXIAL LAYER WAFERS IN A CHAMBER OF A DEPOSITION REACTOR

CROSS REFERENCE TO RELATED APPLICATIONS

This application is a U.S. National Phase application under 35 U.S.C. § 371 of International Application No. PCT/EP2022/054746, filed on Feb. 25, 2022, and claims benefit to European Patent Application No. EP 21161684.2, filed on Mar. 10, 2021. The International Application was published in German on Sep. 15, 2022 as WO 2022/189166 A1 under PCT Article 21(2).

FIELD

The present disclosure is related to a method for producing semiconductor wafers with an epitaxial layer in a chamber of a deposition reactor by means of vapour deposition.

BACKGROUND

A method for producing semiconductor wafers with an epitaxial layer in a chamber of a deposition reactor using vapour deposition is typically interrupted from time to time for the chamber to be maintained, more particularly for removal of material deposited on internal walls of the chamber. The condition of the chamber after such removal is not yet such as to allow the coating therein of semiconductor wafers conforming to the expectations, particularly in terms of the required lifetime of minority charge carriers in the epitaxial layer. The chamber therefore requires conditioning, and this limits the productivity of the method.

US 2008 0 219 824 A1 describes a typical plant that can be used to implement a method for producing semiconductor wafers with an epitaxial layer by means of vapour deposition. Such a plant generally comprises a plurality of deposition reactors, a load lock chamber and a transfer chamber. In particular, a deposition reactor comprises an upper dome, a lower dome, a base ring, and an upper and a lower clamp ring, which belong commonly to a chamber in which the vapour deposition takes place. Located in the chamber in particular are a susceptor support shaft with support arms, a wafer lift shaft and a susceptor. The susceptor support shaft and the wafer lift shaft are connected to a rotating/lifting unit. Disposed above the upper dome and below the lower dome are lamp modules and reflectors, to allow radiant energy to be provided in the chamber during the vapour deposition.

DE 11 2016 003 399 T5 suggests purging the chamber of a deposition reactor with nitrogen for conditioning in the plant, heating the inside of the chamber, and deciding, via measurement of the lifetime of minority charge carriers on test wafers, whether the production of semiconductor wafers with epitaxial layer can be continued.

The chamber conditioning performed in this way significantly limits the productivity of the production of semiconductor wafers with epitaxial layer.

SUMMARY

In an embodiment, the present disclosure provides a method that produces semiconductor wafers with epitaxial layer in a chamber of a deposition reactor of a plant. The method includes: repeatedly depositing a respective epitaxial layer on a respective substrate wafer in the chamber of the deposition reactor, producing a first number of semiconductor wafers with epitaxial layer, and at the same time: conditioning a replacement chamber of the deposition reactor outside the plant by purging the replacement chamber with a purge gas; interrupting the repeated deposition of the respective epitaxial layer on the respective substrate wafer; replacing the chamber with the replacement chamber, wherein after the conditioning, the replacement chamber is sealed and transported in a closed state to the plant or after the conditioning, the replacement chamber is transported to the plant and in this process purge gas is passed through the replacement chamber; and continuing the repeated deposition of the respective epitaxial layer on the respective substrate wafer in the replacement chamber of the deposition reactor, producing a second number of semiconductor wafers with epitaxial layer.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
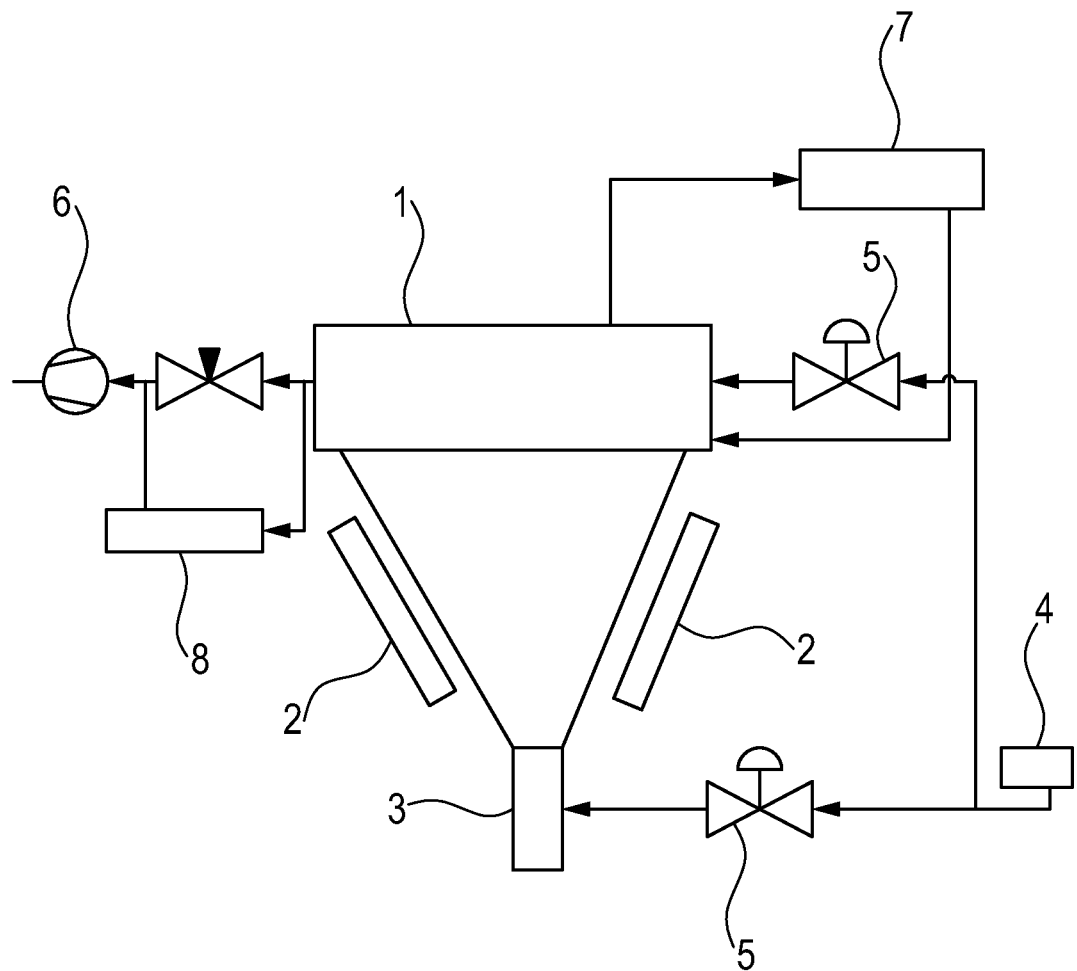
FIG. 1 shows a scheme of the conditioning of a replacement chamber on a conditioning stand according to one embodiment of the invention.

Aspects of the present disclosure reduce the above-described limitations of the state of the art, and to provide particularly effective conditioning.

In an embodiment, the present disclosure provides a method for producing semiconductor wafers with an epitaxial layer in a chamber of a deposition reactor of a plant, the method comprising:
  repeatedly depositing an epitaxial layer on a substrate wafer in the chamber of the deposition reactor, producing a first number of semiconductor wafers with epitaxial layer, and at the same time;
  conditioning a replacement chamber of the deposition reactor outside the plant by purging the replacement chamber with a purge gas;
  interrupting the repeated deposition of an epitaxial layer on a substrate wafer; replacing the chamber by the replacement chamber; and
  continuing the repeated deposition of an epitaxial layer on a substrate wafer in the replacement chamber of the deposition reactor, producing a second number of semiconductor wafers with epitaxial layer.

The time of limited productivity due to conditioning of the chamber is significantly reduced when using the process according to aspects of the present disclosure, and is accounted for, in particular, by the time taken to replace the chamber by the replacement chamber. Following replacement, the chamber replaced by the replacement chamber itself becomes a replacement chamber, which can be conditioned outside the plant. The plant comprises a deposition reactor, preferably at least one further deposition reactor.

Constituents of a replacement chamber comprise, preferably, an upper dome, a lower dome, a base ring, an upper and a lower clamp ring, a susceptor support shaft with support arms, a wafer lift shaft, a susceptor, a lower lamp module with lower reflectors, and a rotating/lifting unit for the shaft. The way in which these constituents are assembled during the conditioning of the replacement chamber is the same as during vapour deposition. An upper lamp module with upper reflectors may optionally likewise be a constituent of the replacement chamber.

The conditioning of the replacement chamber is performed outside the plant, on a conditioning stand, and comprises the purging of the replacement chamber with a purge gas, and preferably one or two further measures. The purge gas is passed through the replacement chamber from at least one gas inlet to at least one gas outlet. The fraction of water in the purge gas on entry of the purge gas into the replacement chamber is preferably less than 100 ppm, more preferably less than 50 ppm. Furthermore, the purge gas is preferably free from particles, more particularly free from metallic particles.

The purge gas is nitrogen, hydrogen, helium, argon, or a mixture of at least two of the stated gases. The use of nitrogen as purge gas is preferred. During purging of the replacement chamber, care should be taken to ensure that as far as possible there are no dead spots in the interior of the replacement chamber at which the flow rate of the purge gas decreases in such a way that it drops off completely.

The further measures include increasing the temperature in the interior of the replacement chamber in comparison to the temperature of the surroundings of the replacement chamber, this being done by means, for example, of infra-red (IR) radiation, heat mats, or heat exchangers, or a combination thereof. The temperature at points on the constituents of the replacement chamber where there is contact with the interior of the replacement chamber is preferably more than 21° C., more preferably more than 65° C. Towards the upper end, the temperature is limited in principle only by the thermal stability of the material that is being heated.

The further measures also include changing of the pressure in the interior of the replacement chamber during conditioning, in which case the change in pressure may be performed in two different ways. Firstly, by lowering the pressure in the interior of the replacement chamber in comparison to the pressure on the conditioning stand, or secondly by increasing the pressure in the interior of the replacement chamber in comparison to the pressure on the conditioning stand. The pressure may be lowered using valves and/or a vacuum pump at the gas outlet of the replacement chamber.

It is also possible, furthermore, to carry out a combination of the two kinds of pressure changes, for example by first increasing the pressure of purge gas in the interior of the replacement chamber and subsequently lowering said pressure below the pressure at the conditioning stand by drawing off the purge gas at the gas outlet.

The conditioning of the replacement chamber is performed for a predetermined time or, preferably, until the fraction of water in the purge gas on departure from the replacement chamber is at or below a predetermined threshold value. For this purpose, it is possible to measure the humidity in the purge gas at—for example—the gas outlet of the replacement chamber.

After conditioning, the replacement chamber may be sealed, in order to prevent the surrounding atmosphere from entering the interior of the replacement chamber as it is transported to the plant. The pressure difference between the pressure in the interior and the pressure in the surroundings of the sealed replacement chamber ought to be extremely small during the transport of the replacement chamber to the plant, in order to prevent possible implosion of the replacement chamber. Replacement of the chamber by the conditioned replacement chamber ought then to take place in an atmosphere of dry purge gas, in order to prevent humidity entering the replacement chamber while the chambers are being switched.

Alternatively, the transport of the chamber to the plant and its replacement may take place with continued purging of the replacement chamber with dry purge gas, so that there is no pressure difference between the interior and the surroundings. In this case a flow rate of 3 Nl/min to 8 Nl/min is advisable.

The semiconductor wafers produced in accordance with the present disclosure consist, preferably, of silicon or comprise silicon substrate wafers with at least one epitaxial layer of silicon-germanium or at least one epitaxial layer of gallium nitride. The diameter of the semiconductor wafers is preferably at least 200 mm, more preferably 300 mm.

FIG. 1 shows a scheme of conditioning a replacement chamber on a conditioning stand according to an exemplary embodiment.

The replacement chamber 1 comprises constituents in the form of an upper dome, a lower dome, a base ring, an upper and a lower clamp ring, a susceptor support shaft with support arms, a wafer lift shaft and a susceptor. Further constituents are a lower lamp module 2 having lower reflectors, and a rotating-lifting unit 3 for the shafts. Dry purge gas is passed through the replacement chamber 1 by means of the gas supply 4, with the volume flow of gas being adjusted by valves 5 at the gas inlet and the capacity of a pump 6 of the gas outlet. The scheme additionally provides for the temperature in the interior of the replacement chamber 1 to be increased by means of a heater 7, and for the humidity of the purge gas after departure from the replacement chamber 1 to be determined by means of a measuring apparatus 8.

An epitaxial layer of silicon was deposited on substrate wafers composed of monocrystalline silica. After the production, respectively, of a first number of semiconductor wafers with epitaxial layer, in the case of a comparative example, the chamber in the deposition reactor was replaced by a different chamber and the different chamber was conditioned in the deposition reactor by purging with purged gas, and, in the case of an illustrative example implemented according to the present disclosure, a replacement chamber was conditioned in accordance with the aspects of the present disclosure. Thereafter, respectively, a second number of semiconductor wafers with epitaxial layer was produced—the semiconductor wafers of the comparative example in the different chamber, and the semiconductor wafers of the illustrative example in the replacement chamber. Afterwards, lifetime measurements of minority charge carriers were performed on the semiconductor wafers produced after conditioning, by means of μ-PCD (microwave photoconductivity decay, a.u.=arbitrary units).

Figure 2:
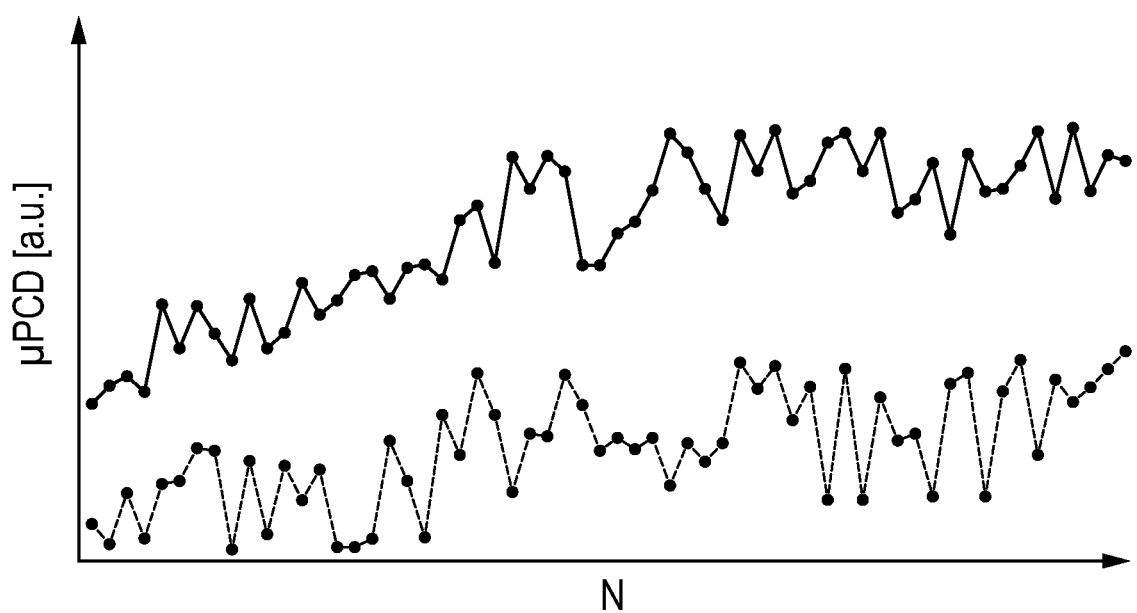
FIG. 2 shows the result of a comparison of lifetime measurements on semiconductor wafers with epitaxial layer.

FIG. 2 shows the result of the measurements for a number N of the semiconductor wafers of the comparative example (dashed curve) and of the illustrative example (continuous curve), respectively. The values for the lifetime were higher at the start for the semiconductor wafers produced in accordance with the present disclosure, and immediately show an increasing trend.

The above description of illustrative embodiments should be understood as representing examples. The resultant disclosure on the one hand enables the skilled person to understand the present disclosure and its associated advantages, and on the other hand, within the understanding of the skilled person, also embraces obvious adaptations and modifications of the structures and methods described. The intention is therefore that all such adaptations and modifications, and also equivalents, are to be covered by the scope of protection of the claims.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS USED

1 Replacement chamber
2 Lamp module
4 Rotating-lifting-unit
4 Gas supply
5 Valve
6 Pump
7 Heater
8 Measuring apparatus

The invention claimed is:

1. A method for producing semiconductor wafers with epitaxial layer in a chamber of a deposition reactor of a plant, the method comprising
   repeatedly depositing a respective epitaxial layer on a respective substrate wafer in the chamber of the deposition reactor, producing a first number of semiconductor wafers with epitaxial layer, and at the same time:
      conditioning a replacement chamber of the deposition reactor outside the plant by purging the replacement chamber with a purge gas;
      interrupting the repeated deposition of the respective epitaxial layer on the respective substrate wafer;
      replacing the chamber with the replacement chamber, wherein after the conditioning, the replacement chamber is sealed and transported in a closed state to the plant or after the conditioning, the replacement chamber is transported to the plant and in this process purge gas is passed through the replacement chamber; and
      continuing the repeated deposition of the respective epitaxial layer on the respective substrate wafer in the replacement chamber of the deposition reactor, producing a second number of semiconductor wafers with epitaxial layer.

2. The method according to claim 1, wherein the purge gas is passed through the replacement chamber, and a fraction of water in the purge gas on entry into the replacement chamber is less than 50 ppm.

3. The method according to claim 1, wherein the purge gas used comprises nitrogen, hydrogen, helium, argon, or a mixture of at least two of the stated gases.

4. The method according to claim 1, wherein during the conditioning of the replacement chamber, a temperature in an interior of the replacement chamber is increased in comparison to a temperature of surroundings of the replacement chamber.

5. The method according to claim 1, wherein during the conditioning of the replacement chamber, a pressure in an interior of the replacement chamber is changed at least once in comparison to a pressure in surroundings of the replacement chamber.

6. The method according to claim 1, wherein a humidity of the purge gas is measured after departure from the replacement chamber, and the conditioning of the replacement chamber is continued for as long as the humidity is not yet at or below a predetermined threshold value.

* * * * *